United States Patent [19]
Housen et al.

[11] Patent Number: 5,396,117
[45] Date of Patent: Mar. 7, 1995

[54] SEMICONDUCTOR DEVICE WITH INDEPENDENT OVER-CURRENT AND SHORT-CIRCUIT PROTECTION

[75] Inventors: Toru Housen; Manabu Watanabe, both of Nagano, Japan

[73] Assignee: Fuji Electric Co., Ltd., Kawasaki, Japan

[21] Appl. No.: 156,585

[22] Filed: Nov. 23, 1993

[30] Foreign Application Priority Data

Nov. 25, 1992 [JP] Japan .................. 4-313825

[51] Int. Cl.⁶ .................. H03K 17/687; H03K 3/26
[52] U.S. Cl. .................. 327/480; 327/434; 327/577; 327/50; 327/479
[58] Field of Search .................. 307/299.2, 299.1, 574, 307/575, 577, 581, 584, 491, 570, 350, 362, 568, 571, 360

[56] References Cited

U.S. PATENT DOCUMENTS

| | | | |
|---|---|---|---|
| 4,155,014 | 5/1979 | Tung | 307/299.2 |
| 4,577,125 | 3/1986 | Allen | 307/299.2 |
| 5,061,863 | 10/1991 | Mori et al. | 307/350 |
| 5,091,664 | 2/1992 | Furuhata | 307/575 |

*Primary Examiner*—Timothy P. Callahan
*Assistant Examiner*—Toan Tran
*Attorney, Agent, or Firm*—Brumbaugh, Graves, Donohue & Raymond

[57] ABSTRACT

By disposing various current-sensing layers on a semiconductor element with a current-sensing function, wherein signals corresponding to the sensing currents derived from each current-sensing electrode are inputted independently into said over-current control circuit and short-circuit control circuit in a control circuit for said semiconductor element; or by constructing the current-sensing resistor in said control circuit with various resistors connected in series, wherein a single sensing current flows into this resistor to generate various detection voltages divided by the resistor, while detection voltages with different values are inputted independently into said main current turn-off command circuit and main current control circuit the value $I_{oc}$ of the over-current detection level for the semiconductor element with a current-sensing function and the value $I_{sct}$ at the short-circuit current detection level can be set independently of each other. Therefore, while increasing $I_{oc}$, setting $I_{sct}$ within a short-circuit current withstand capacity of the semiconductor element, and extending the upper limit in the main current of said semiconductor element, it is possible to avoid element breakdown due to a short-circuit current.

11 Claims, 3 Drawing Sheets

SEMICONDUCTOR DEVICE WITH INDEPENDENT OVER-CURRENT AND SHORT-CIRCUIT PROTECTION

TECHNICAL FIELD

This invention relates to a semiconductor device that uses a semiconductor element with a current-sensing function, which is now widely applied in the area of power electronics equipment; for example, in an invertor device and in a servo-motor driving device.

BACKGROUND OF THE INVENTION

It is necessary to first describe the operation of a conventional semiconductor to fully understand the present invention.

FIG. 5 is a circuit diagram of the major part of a conventional semiconductor device that uses a semiconductor element with a current sensing function. The semiconductor device is comprised of two components, a semiconductor element 6 and a control circuit 7. The control circuit 7 monitors and protects the semiconductor element 6 against over-current and short-circuit surges.

In FIG. 5, the semiconductor element with a current sensing function is shown as an IGBT 6 with a sensing function. Control circuit 7 is connected to IGBT 6.

The IGBT 6 is disposed with a collector terminal 6a, acting as a main electrode, an emitter terminal 6b, acting as another main electrode, a gate terminal 6c, acting as a control electrode, and an output terminal 6e for the current-sensing electrode 6d. This IGBT 6 turns a load device (not shown) on and off according to a drive signal 7a outputted from control circuit 7. When the IGBT 6 receives the drive signal 7a as an "on" signal, a main current 6f flows from the terminal 6a to the terminal 6b and powers the load device. When the IGBT 6 receives the drive signal 7a as an "off" signal, the main current 6f is turned off and stops powering the load device.

When the main current 6f flows from the IGBT 6, a sensing current 6g with a value proportional to the main current 6f flows from the current-sensing layer 6d to the output terminal 6e of IGBT 6.

FIG. 6 shows the composition of the aforementioned IGBT 6. As shown in FIG. 6, the IGBT 6 has an emitter layer 63 with a large area formed on the surface of a semiconductor substrate 61. This surface also contains a gate layer 64 and current-sensing layer 6d, whose surface area is smaller than that of the emitter layer 63. The collector layer (not shown in FIG. 6) is formed on the layer opposite the emitter layer 63.

The control circuit 7 consists of a drive circuit 71, a current-sensing resistor 72, a gate resistor 73 disposed as required, an over-current control circuit 74, and a short-circuit control circuit 75.

The operation of control circuit 7 is as follows:

The drive circuit 71 uses as its input a signal 7b generated by a control circuit at a previous stage, which is not shown, and a deactivating signal 7f generated by over-current control circuit 74. In the normal operation, the drive circuit 71 generates the drive signal 7a to turn the IGBT 6 on and off according to the activating signal 7b via the gate resistor 73.

In addition, when under certain circumstances, the deactivating signal 7f is generated and inputted to the drive circuit 71, the latter causes the signal 7a an "off" signal for the IGBT 6, regardless of what value to become signal 7b is, and forces the voltage between the emitter 6b and the gate 6c nearly zero, turning IGBT 6 off.

Current-sensing resistor 72 has a resistance value $R_s$, and generates a detection voltage V6, proportional to the flowing sensing current 6g which in turn is proportional to the main current 6f.

The over-current control circuit 74 includes a comparator 741 and a reference voltage source 742, which provides a reference voltage E1 used to make determinations in the comparator 741. The reference voltage E1 is selected at a voltage value that is higher than the detection voltage V6 corresponding to the value of the main current 6f when the IGBT 6 is in the normal operation.

If the value of the detection voltage V6 exceeds the value of the selected reference voltage E1, the over-current control circuit 74 is triggered and generates the signal 7f to deactivate the drive circuit 71, thereby stopping main current 6f from flowing to the load device.

The short-circuit control circuit 75 consists of an NPN transistor 751 and a Zener diode 752 which is used as a constant voltage diode. The anode of diode 752 is connected to the collector of the transistor 751; its cathode is connected to the drive signal 7a, and the base of the transistor is connected to the current sensing resistor 72. With this arrangement, the detection voltage V6 across the resistor 72 can be sensed.

If the value of the detection voltage V6 exceeds the threshold voltage ($V_{th}$) of the transistor 751, this transistor will be turned on, while the voltage between the gate terminal 6c and the emitter terminal 6b of the IGBT 6 is reduced to the constant break-down voltage value of the Zener diode 752.

With the above arrangements, the control circuit monitors and protects against any increases in the main current 6f above the normal level. If, for any reason, during the normal operation the value of the main current 6f increases, causing the value of the detection voltage V6 across current-sensing resistor 72 to exceed the reference voltage E1, the over-current control circuit 74 will detect this condition and generate the deactivating signal 7f to the drive circuit 71. The drive circuit 71, upon receiving the deactivating signal 7f, would switch the drive signal 7a to a low (L) level signal, forcing the IGBT 6 to turn off and stop the over-current.

In addition, if the value of main current 6f increases abruptly as a result of a short-circuit of said load device, the signal transmitted from over-current control circuit 74 cannot reduce the main current via drive circuit 71 instantaneously because of the time delay in the signal transmission along the transmission path. This would allow an excessive current 6f to continue to flow from IGBT 6 into load device.

In such a case, the short-circuit control circuit 75, which has a higher response speed, would detect the sharp increase in the main current 6f, and send its output signal directly to IGBT 6 without going through drive circuit 71. When the detection voltage reaches the predetermined level, the transistor is turned on and the Zener diode 752 breaks down to produce a constant voltage level. This quickly reduces the main current 6f to a value in response to the constant voltage diode that IGBT 6 can tolerate.

The main current remains subdued until IGBT 6 is turned off according to drive circuit 71 caused by a deactivation signal 7f from the over-current control circuit 74.

Through the above measure, the IGBT 6 and its load device are protected from main current 6f which exceeds normal current levels, making it possible to properly operate the system.

The main current value is altered when either the over-current control circuit 74 or short-circuit control circuit 75 are triggered by an over-current value. The value of the main current 6f obtained when the over-current control circuit 74 is triggered and generates an over-current detection signal 7f, is denoted $I_{oc}$. The value of the sensing current 6g at the time of over-current is denoted $i_{oc}$. The ratio between the two current values is denoted N. The resistance value in the current-sensing resistor 72 is $R_s$ and the reference voltage used to compare signals is denoted E1. Using these defined variables, the following formula 1 can be formulated:

$$E1 = i_{oc} \times R_s$$

$$i_{oc} = I_{oc}/N$$

$$I_{oc} = N \times E1/R_s \qquad 1$$

The value of the main current 6f obtained when the NPN transistor 751 of the short-circuit control circuit 75 is turned on by a value defined at the short-circuit current detection level is $I_{sct}$. The value of the sensing current 6g at this time is denoted $i_{sct}$. The threshold voltage for the transistor 751 is $V_{th}$. The following formula 2 can then be formulated:

$$V_{th} = i_{sct} \times R_s$$

$$i_{sct} = I_{sct}/N$$

$$I_{sct} = N \times V_{th}/R_s \qquad 2$$

Because the conventional control circuit 7 commonly uses the detection voltage V6 generated by sensing current 6g at the resistor 72 as the input signals of both the over-current control circuit 74 and the short-circuit control circuit 75, the former acting according to formula 1 and the latter acting according to formula 2, the ratio $I_{oc}/I_{sct}$ of these two current values is equivalent to the ratio $E1/V_{th}$ of the two voltage values.

Therefore, once the reference voltage E1 and threshold voltage $V_{th}$ are determined, neither current value, $I_{oc}$ or $I_{sct}$, can be set independently because the ratio must be equal to $E1/V_{th}$.

For this reason, if, for example, the value, $I_{oc}$, is increased so that a device may be used with the main current 6f up to a larger permissible value, the current value, $I_{sct}$, must also be increased. If the main current 6f increases suddenly because of a short-circuit or some other failure, the IGBT 6 and load device will be subject to the risk of a current break-down.

SUMMARY OF THE INVENTION

The purpose of the present invention is to solve the above technical problems by providing a semiconductor device that can set the two current values, $I_{oc}$ and $I_{sct}$, independently of each other.

With respect to the operation of a over-current control circuit and a short-circuit control circuit, which protect semiconductor elements from excessive main currents, in semiconductor device consisting of a semiconductor element with a current-sensing function and a control circuit, it has not been possible to set the current value, $I_{oc}$, at an over-current detection level and the current value, $I_{sct}$, at a short circuit current detection level independently of each other in conventional circuitry.

The present invention solves this problem in a conventional semiconductor device in the following ways:

The first embodiment is circuitry so structured that various current-sensing layers are disposed on a semiconductor element with a current-sensing function, wherein the detection signals for each of the sensing currents derived from each of the current-sensing layers are inputted independently into said over-current control circuit and short-circuit control circuit.

To generate detection signals from each of the currents in this case, current-sensing resistors, which can generate detection voltages that are proportional to the sensing current, are disposed for each sensing current, while the required resistance values for these resistors are individually selected, so that the two current values, $I_{oc}$ and $I_{sct}$, can be set independently of each other.

A second embodiment is circuitry so structured that the sensing current derived from the current-sensing layers on the semiconductor element with a current-sensing function flows into the current sensing resistors connected in series, where the voltage signals generated by said sensing current in the resistors are divided at a predetermined ratio of the resistor values, and two different voltage levels thereby derived are independently inputted into said over-current control circuit and short-circuit control circuit. Therefore, by individually selecting said voltage ratios, the two current values, $I_{oc}$ and $I_{sct}$, can again be set independently of each other.

A third embodiment is circuitry so structured that, when the various semiconductor elements with a current-sensing function are connected in parallel, the current-sensing layers corresponding to these semiconductor elements are also connected in parallel, thereby generating a combined total current of the sensing currents from each sensing layer. The current detection signals obtained from the total current into the current-sensing resistors as described in the first and second embodiments above are inputted independently into said over-current control circuit and short-circuit control circuit, respectively, allowing once again $I_{oc}$ and $I_{sct}$ to be set independently.

The parallel-connected semiconductor elements are protected against over-current of the combined total main current.

BRIEF DESCRIPTION OF THE DRAWINGS

Further objects, features and advantages of the invention will become apparent from the following description taken in conjunction with the accompanying figures showing a preferred embodiment of the invention, on which.

Figure 1:
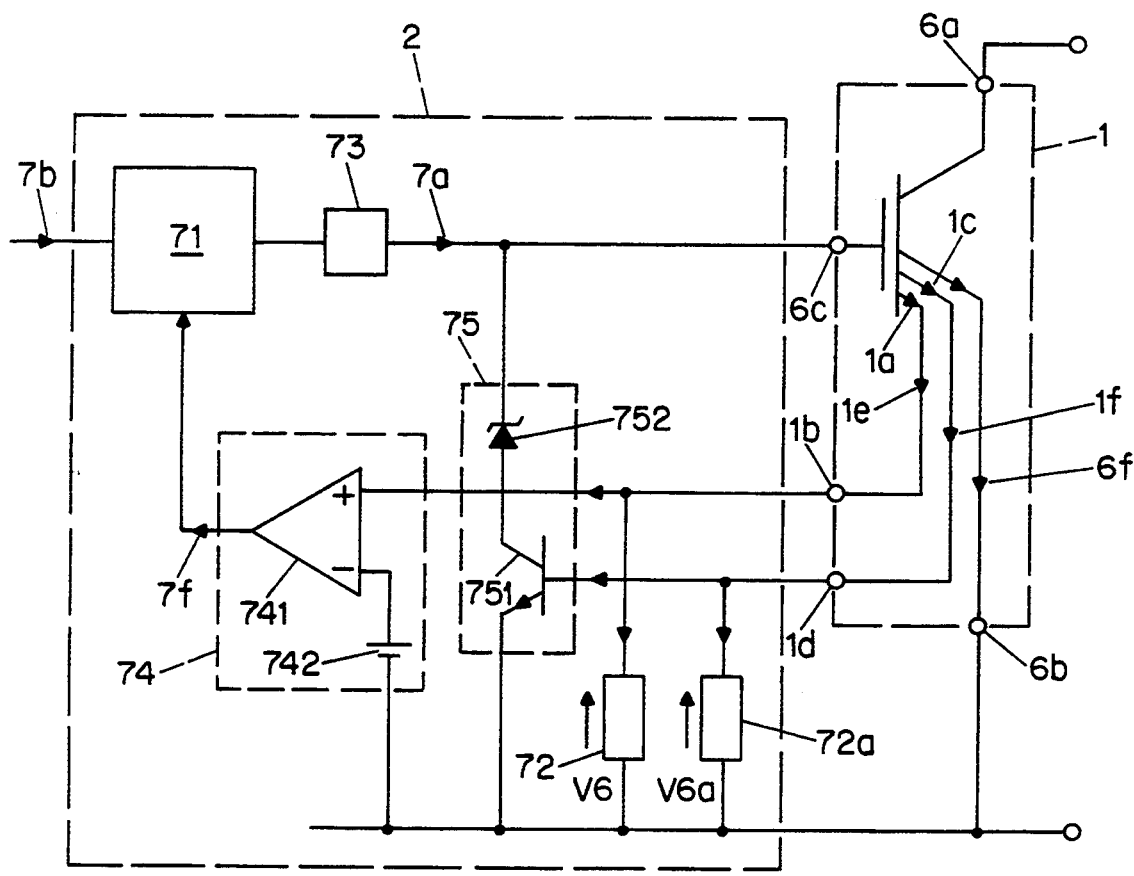
FIG. 1 is a circuit diagram for the critical part of a semiconductor device according to a first embodiment of the present invention utilizing a second current sensing layer.

Throughout the figures, the same reference numerals and characters, unless otherwise stated, are use to denote like features, elements, components or portions of the illustrated embodiment. Moreover, while the subject invention will now be described in detail with reference to the figures, it is done so in connection with a preferred embodiment. It is intended that changes and modifications can be made to the described embodiment without departing from the true scope and spirit of the subject invention as defined by the appended claims.

DETAILED DESCRIPTION OF THE PREFERRED EMBODIMENTS

Figure 5:
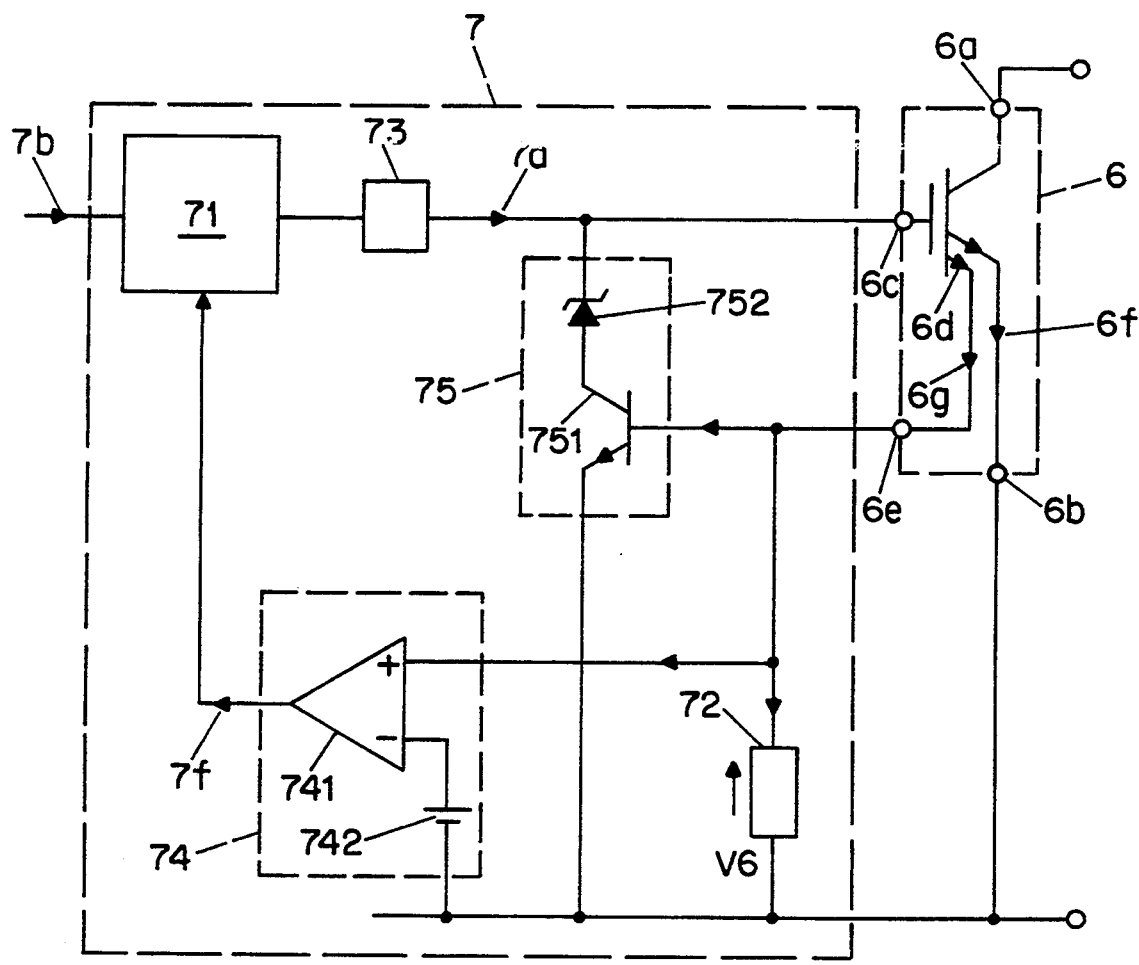
FIG. 5 is a circuit diagram for the critical part of a conventional semiconductor device.
Figure 6:
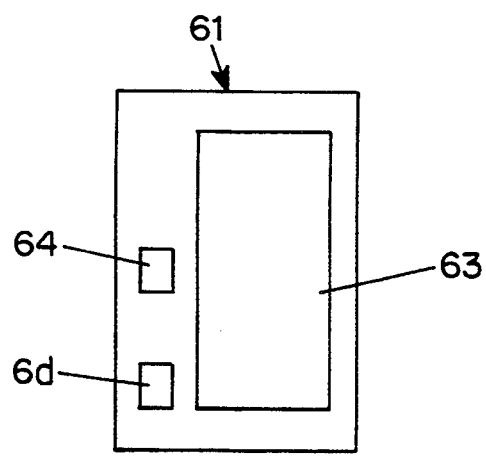
FIG. 6 is a diagram showing the construction of a semiconductor element with a current-sensing function that is shown in FIG. 5.

FIG. 1 shows a circuit diagram of the critical part of the semiconductor device corresponding to the first preferred embodiment. In FIG. 1, those parts which are identical to the part of the conventional semiconductor shown in FIG. 5 are given the same numbers, and the explanations for the common parts are described in the background.

In FIG. 1, an IGBT 1 with a current-sensing function and two current sensing layers is one example of a semiconductor element with a current-sensing function, and situated adjacent to it is a control circuit 2 for the IGBT 1.

The IGBT 1 includes a collector terminal 6a as a main electrode, an emitter terminal 6b as another main electrode, a gate terminal 6c as a control electrode, an output terminal 1b for the first current-sensing layer 1a, and an output terminal 1d for the second current-sensing layer 1c. IGBT 1 turns the device on and off according to the drive signal 7a outputted from control circuit 2, causing a main current 6f to flow from terminal 6a to terminal 6b when the device is turned on, and turns main current 6f off when drive signal 7a switches to a turn-off signal.

When main current 6f flows out of IGBT 1, the sensing currents 1e and 1f, which have values proportional to main currents 6f, flow out from first current sensing layer 1a and second current sensing layer 1c, and these currents are led from output terminals 1b and 1d externally to control circuit 2.

Figure 2:
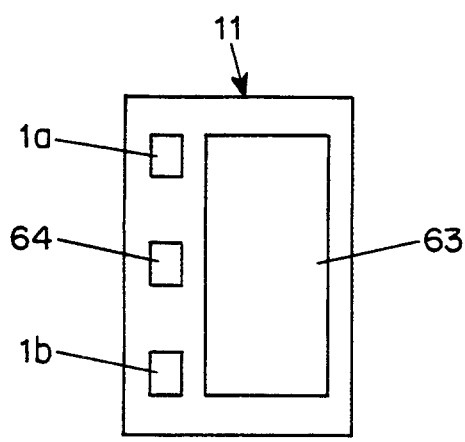
FIG. 2 is a diagram showing the construction of the semiconductor element with a current-sensing function that is shown in FIG. 1.

FIG. 2 is a diagram showing the construction of aforementioned IGBT 1. As shown in FIG. 2, IGBT 1 has an emitter layer 63 with a large area formed on the surface of a semiconductor substrate 11. The surface that has this emitter layer also has a gate layer 64 and a first current-sensing layer 66, as well as a second current-sensing layer 1b with a sufficiently smaller area than that of emitter layer 63. Incidentally, the collector is formed on the face opposite to the face on which the emitter 63 is located.

Control circuit 2 has a current-sensing resistor 72 added to the conventional control circuit 7 shown in FIG. 5. Current-sensing resistor 72 generates a detection voltage V6, which is proportional to flowing sensing current 1e, and is consequently proportional to main current 6f. This detection voltage is inputted into a comparator 741 in the over-current control circuit 74.

The other current-sensing resistor 72a, which has a resistance value $R_{sa}$, generates a detection voltage V6a which is proportional to flowing sensing current 1f, and is consequently proportional to main current 6f. This detection voltage is inputted into the base of the NPN transistor 751 in the short-circuit control circuit 75.

In the above-described circuitry, if signal 7a sent to IGBT 1 is a turn-on command signal, and the value of main current 6f increases, for any reason, and reaches the value $I_{oc}$ of the over-current detection level, thereby causing the value of detection voltage V6 generated by current-sensing resistor 72 to reach its reference voltage E1, over-current control circuit 74 detects this condition and applies a deactivating signal 7f to the drive circuit 71. Drive circuit 71 which receives signal 7f then converts this output signal 7a to a low (L) level signal, and turns IGBT 1 off.

In addition, if the value of main current 6f increases abruptly because the short-circuit failure reaches the value $I_{sct}$ of the short-circuit current detection level, and the value of detection voltage V6a detected by current-sensing resistor 72a reaches the threshold voltage $V_{th}$, then transistor 751 turns on and the main current 6f decreases rapidly to the break-down voltage value of the Zener diode 752 which the IGBT 1 can tolerate.

In this case, the following formulas 3 and 4 can be formulated with respect to the current values $I_{oc}$ and $I_{sct}$ at their respective current detection levels:

$$I_{oc} = N \times E1/R_s \qquad 3$$

$$I_{sct} = N \times V_{th}/R_{sa} \qquad 4$$

Where N is the ratio of the main current to the sensor current.

In the formulas, these two resistance values $R_s$ and $R_{sa}$ are the values found in current-sensing resistors 72 and 72a, and they can be set independently of each other. Therefore, said current values $I_{oc}$ and $I_{sct}$ can also be set independently of each other.

This means that the ratio between said current values, $I_{oc}/I_{sct}$, can be varied by properly selecting the ratio between resistance values $R_{sa}$ and $R_s$, even after the reference voltage E1 and threshold voltage $V_{th}$ have been determined.

A smooth protective operation can be performed even when the current value ratio, $I_{oc}/I_{sct}$, is the same as the voltage ratio, $E1/V_{th}$, by selecting identical resistance values for $R_s$ and $R_{sa}$.

Figure 3:
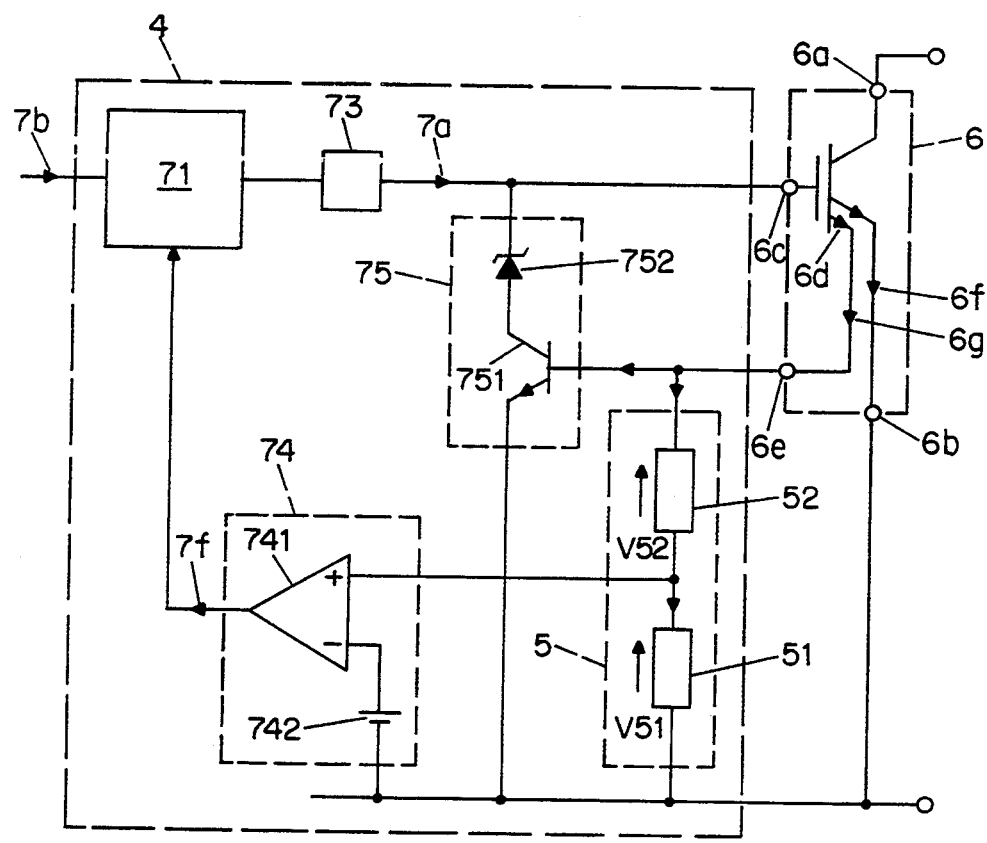
FIG. 3 is a circuit diagram for the critical part of a semiconductor device according to a second embodiment of the present invention utilizing resistor means in series.

FIG. 3 is a circuit diagram for the critical part of a semiconductor device corresponding to a second embodiment of the invention. In FIG. 3, the parts identical to those of the conventional semiconductor shown in FIG. 5 are given the same numerals, and their description is given in the background.

In FIG. 3, the control circuit 4 for the IGBT 6 is disposed with a current-sensing resistor 5, which is different from the current-sensing resistor 72 used in conventional control circuits 7.

Current-sensing resistor 5 is constructed with resistors 51 and 52 connected in series, and having resistance values of $R_{s51}$ and $R_{s52}$. When the sensing current 6g flows into this resistor 5 from IGBT 6, the voltage drops (V51 and V52) across the resistors 51 and 52 are in proportion to the main current 6f that are generated at the resistors 51 and 52.

Voltage drop V51 is then inputted into comparator 741 in over-current control circuit 74 as a detection voltage of the main current 6f.

The total of said voltage drops V51 and V52 is also inputted into the base of NPN transistor 751 in the short-circuit control circuit 75 as the detection voltage of main current 6f. In the above-described circuitry, if signal 7a sent to IGBT 6 is a turn-on command signal, and the value of main current 6f increases for any reason and reaches the value I oc of the over-current detection level, the over-current control circuit 74 detects this condition through the detection voltage V51 and outputs deactivation signal 7f to drive circuit 71. Drive circuit 71 receiving signal 7f converts its output signal 7a into a low-level (L) signal, and forces IGBT 6 to turn off.

In addition, if the value of main current 6f increases abruptly because the short-circuit failure reaches the value $I_{sct}$ of the short-circuit current detection level, and the value of the detection voltage detected at current-sensing resistor 5, that is a total of the voltage drops V51 and V52, reaches the threshold voltage $V_{th}$, then transistor 751 turns on, the Zener diode breaks down to produce a constant voltage level, and main current 6f rapidly decreases to a value in response to the constant voltage diode that the IGBT 6 can tolerate.

In this case, the following formulas 5 and 6 can be formulated with respect to the current values $I_{oc}$ and $I_{sct}$ at said respective current detection levels:

$$I_{oc}=N\times E1/R_{s51} \qquad 5$$

$$I_{sct}=N\times V_{th}/R_{s51}+R_{s52} \qquad 6$$

Where N is the ratio of the main current to the sensor current.

In these formulas, the two resistance values $R_{s51}$ and $R_{s52}$ represent the resistance values in the resistors 51 and 52, respectively, which can be set independently of each other. Therefore, said current values $I_{oc}$ and $I_{sct}$ can also be set independently of each other.

This means that the ratio between said current values, $I_{oc}/I_{sct}$, can be varied by properly selecting the ratio between the resistance values, $(R_{s51}+R_{s52})/R_{s51}$, even after the reference voltage E1 and threshold voltage $V_{th}$ have been determined.

Figure 4:
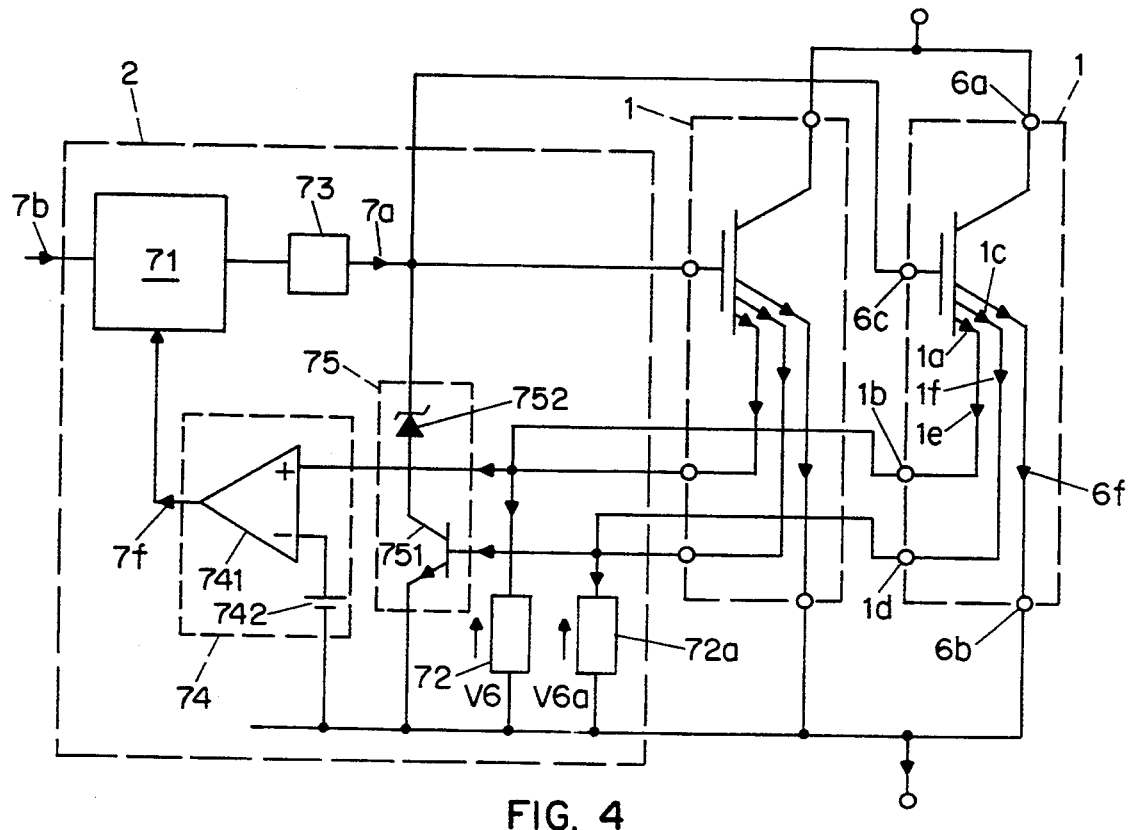
FIG. 4 is a circuit diagram for the critical part of a semiconductor device according to a third embodiment of the present invention utilizing semiconductor elements in parallel.

FIG. 4 is a circuit diagram of the critical part of a semiconductor device corresponding to a third preferred embodiment. In FIG. 4, the parts identical to the parts of the conventional semiconductor shown in FIG. 5 are given the same numbers, and their explanations are given in the background.

The semiconductor device shown in FIG. 4 differs from the first preferred embodiment, which is shown in FIG. 1, in that the semiconductor device has two IGBTs i in FIG. 4.

The IGBTs 1 are connected in parallel to each other by each semiconductor device's corresponding terminals, 6a, 6b, 6c, 1b and 1d. The IGBTs 1 are connected to their respective load devices (not shown).

Therefore, the current-sensing resistor 72 generates detection voltage V6 which is a function of the sum of the sensing currents 1e which are proportional to the respective main currents 6f for IGBTs (1).

Furthermore, current-sensing resistor 72a generates the detection voltage V6a that is in proportion to the total of main currents 6f in IGBT 1 when the sum of the sensing currents 1f from each of two IGBTs 1 connected in parallel flows in.

Incidentally, the roles of the detection voltages V6 and V6a are identical to those of the semiconductor device shown in FIG. 1.

Now, when the current values, $I_{oc}$ and $I_{sct}$, at the current detection levels relative to said IGBTs 1 are referred to as $I_{oca}$ and $I_{ocb}$ and as $I_{scta}$ and $I_{sctb}$, the following formulas 7 and 8 can be formulated:

$$I_{oca}+I_{ocb}=N\times E1/R_s \qquad 7$$

$$I_{scta}+I_{sctb}=N\times V_{th}/R_{sa} \qquad 8$$

Where N is the ratio of the main current to the sensor current.

In these formulas, the two resistance values $R_s$ and $R_{sa}$ represent the resistance values in current-sensing resistors 72 and 72a, respectively, which can be set independently of each other. Therefore, said current values $(I_{oca}+I_{ocb})$ and $(I_{scta}+I_{sctb})$ can also be set independently of each other.

This means that the IGBTs 1 with current-sensing function connected in parallel are protected against excessive main currents, that is, not against individual main currents but against the total main current. The ratio between said current values, $(I_{oca}+I_{ocb})/(I_{scta}+I_{sctb})$ can therefore be varied by properly selecting the ratio between the resistance values, $R_{sa}/R_s$, regardless if the values of the reference voltage E1 and threshold voltage $V_{th}$ have been determined.

The foregoing merely illustrates the principles of the invention. It will thus be appreciated that those skilled in the art will be able to devise numerous systems and methods which, although not explicitly shown or described herein, embody the principles of the invention and are thus within the spirit and scope of the invention.

For example, according to the above explanation, which uses FIG. 4 that shows a third embodiment of the invention, two IGBTs were connected in parallel. However, this number should not be limited to this example, since it is apparent to a person skilled in the art to connect more than two parallel IGBT's.

In addition, the IGBTs which have a main current-sensing function have been shown to have various current-sensing layers. However, the present invention should not be limited to this construction, but there need be only one current-sensing electrode for each IGBT according to the FIG. 3, and all the current sensing electrodes may be connected in common to one current sensing resistor.

Furthermore, the IGBT described above is a semiconductor element with current-sensing function. However, a transistor of another type, such as a MOSFET with current-sensing function, may also be used.

We claim:

1. A semiconductor device adapted to monitor and protect against over-current and short-circuit in a load device, said device comprising, in combination:

at least one current-sensing semiconductor element having collector and emitter layers adapted to be connected to respective terminals of a load device to be protected, a gate layer, and at least one current-sensing layer having an area smaller than the area of said emitter layer adapted to produce two or more sensing-currents proportional to the current produced by the emitter layer; and control circuit means coupled to the gate layer of said semiconductor device for controlling a flow of main current in said semiconductor element, said control circuit means comprising:

first circuit means including first resistance means for receiving a first selected one of said sensing-currents from said semiconductor element, and a constant voltage device for applying a fixed voltage to the gate layer of said semiconductor element in response to said main current when exceeding a predetermined short-circuit level, and second circuit means including comparator means, a reference voltage source connected to a first input terminal of said comparator means, and second resistance means for receiving a second selected one of said sensing-currents from said semiconductor element for turning said semiconductor element off in response to said main current when exceeding a predetermined over-current level, said second resistance means being connected to a second input terminal of said comparator means;

whereby voltages developed by sensing-current from said semiconductor element flowing through said first and second resistance means are independent of each other to allow independency of said predetermined short-circuit and over-current levels.

2. The semiconductor device according to claim 1, wherein said first circuit means further includes switch means connected to said constant voltage device, said switch means adapted to be turned on in response to a voltage developed across said first resistance means exceeding a predetermined voltage.

3. The semiconductor device according to claim 2, wherein said second resistance means, the second selected sensing-current of said semiconductor element and said second input terminal of said comparator means are commonly connected with one another, and said first resistance means is also connected to the first selected sensing-current of said semiconductor element.

4. The semiconductor device according to claim 3, wherein said switch means comprises a transistor, said constant voltage device comprises a diode, wherein a collector of said transistor is connected to an anode of said diode, and a base of said transistor is connected to said first resistance means, and a cathode of said diode is connected to said gate layer of said semiconductor element.

5. A semiconductor device adapted to monitor and protect against over-current and short-circuit in a load device, said device comprising, in combination:

at least one current-sensing semiconductor element having collector and emitter layers adapted to be connected to respective terminals of a load device to be protected, a gate layer, and at least one current-sensing layer having an area smaller than the area of said emitter layer adapted to produce one or more sensing-currents proportional to the current produced by the emitter layer; and control circuit means coupled to the gate layer of said semiconductor device for controlling a flow of main current in said semiconductor element, said control circuit means comprising:

first circuit means including first resistance means for receiving a first selected one of said sensing-currents from said semiconductor element, and a constant voltage device for applying a fixed voltage to the gate layer of said semiconductor element in response to said main current when exceeding a predetermined short-circuit level, and second circuit means including comparator means, a reference voltage source connected to a first input terminal of said comparator means, and second resistance means for receiving said first selected sensing-currents from said semiconductor element for turning said semiconductor element off in response to said main current when exceeding a predetermined over-current level, said second resistance means being connected to a second input terminal of said comparator means;

whereby voltages developed by sensing-current from said semiconductor element flowing through said first and second resistance means are independent of each other to allow independency of said predetermined short-circuit and over-current levels.

6. The semiconductor device according to claim 5, wherein the first and second resistance means are connected in series to each other and to said first selected current-sensing layer of said semiconductor element, a junction of said first and second resistance means being connected to said second input terminal of said comparator means, and wherein said first circuit means further includes switch means connected to said constant voltage device, said switch means adapted to be turned on in response to the voltage developed across said first and second resistance means exceeding a predetermined voltage.

7. The semiconductor device according to claim 6, wherein said switch means comprises a transistor, said constant voltage device comprises a diode, wherein a collector of said transistor is connected to an anode of said constant voltage diode, and a base of said transistor is connected to said first and second resistance means connected in series, and the cathode of said diode is connected to said gate layer of said semiconductor element.

8. The semiconductor device according to claim 1, wherein said at least one semiconductor element comprises two or more semiconductor elements which are connected in parallel to one another, with the respective current sensing layers commonly connected, the respective predetermined short-circuit and over-current levels being a function of magnitudes of sensing-currents flowing from said current sensing layers.

9. A semiconductor device according to claim 1 wherein said semiconductor element comprises an insulated gate bipolar transistor.

10. The semiconductor device according to claim 5, wherein said at least one semiconductor element comprises two or more semiconductor elements which are connected in parallel to one another, with the respective current sensing layers commonly connected, the respective predetermined short-circuit and over-current levels being a function of magnitudes of sensing-currents flowing from said current sensing layers.

11. A semiconductor device according to claim 5 wherein said semiconductor element comprises an insulated gate bipolar transistor.

* * * * *